(12) United States Patent
Yukawa et al.

(10) Patent No.: US 9,857,829 B2
(45) Date of Patent: *Jan. 2, 2018

(54) INFORMATION PROCESSING APPARATUS

(71) Applicant: SONY CORPORATION, Tokyo (JP)

(72) Inventors: Shuhei Yukawa, Nagano (JP);
Masayoshi Koganei, Nagano (MY);
Toshiyuki Sasaki, Nagano (JP);
Takashi Enomoto, Nagano (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/241,917

(22) Filed: Aug. 19, 2016

(65) Prior Publication Data
US 2016/0357218 A1 Dec. 8, 2016

Related U.S. Application Data

(63) Continuation of application No. 14/338,126, filed on Jul. 22, 2014, now Pat. No. 9,436,216.

(30) Foreign Application Priority Data

Jul. 31, 2013 (JP) ................................. 2013-159960

(51) Int. Cl.
G06F 1/16 (2006.01)
H01Q 1/22 (2006.01)
H01Q 13/10 (2006.01)
H05K 7/20 (2006.01)
H01Q 21/28 (2006.01)
G06F 1/20 (2006.01)

(52) U.S. Cl.
CPC .......... *G06F 1/1605* (2013.01); *G06F 1/1601* (2013.01); *G06F 1/166* (2013.01); *G06F 1/20* (2013.01); *H01Q 1/2258* (2013.01); *H01Q 1/2266* (2013.01); *H01Q 13/10* (2013.01); *H01Q 13/106* (2013.01); *H01Q 21/28* (2013.01); *H05K 7/20136* (2013.01); *H05K 7/20418* (2013.01); *H05K 7/20963* (2013.01); *H05K 7/20972* (2013.01); *G06F 2200/1631* (2013.01)

(58) Field of Classification Search
CPC combination set(s) only.
See application file for complete search history.

(56) References Cited

U.S. PATENT DOCUMENTS

| 4,980,848 A  * | 12/1990 | Griffin .................... G06F 1/203 361/679.09 |
| 6,563,705 B1 * | 5/2003  | Kuo ......................... G06F 1/16 349/58 |
| 7,821,782 B2 * | 10/2010 | Doherty ................ G06F 1/1626 361/679.26 |
| 7,961,458 B2 * | 6/2011  | Yukawa ................ G06F 1/1601 29/592.1 |
| 8,218,303 B2 * | 7/2012  | Kurachi .................... G06F 1/16 248/917 |
| 8,248,780 B2 * | 8/2012  | Zheng ....................... G06F 1/16 165/80.3 |

(Continued)

*Primary Examiner* — Lisa Lea Edmonds
(74) *Attorney, Agent, or Firm* — Chip Law Group

(57) ABSTRACT

There is provided an information processing apparatus including a case which is provided with an opening. Two or more functional units are allocated to the opening.

11 Claims, 7 Drawing Sheets

(56) References Cited

U.S. PATENT DOCUMENTS

| | | | | |
|---|---|---|---|---|
| 8,482,907 | B2* | 7/2013 | Take | F16M 13/02 248/917 |
| 8,570,727 | B2* | 10/2013 | Chang | G06F 1/1601 361/679.21 |
| 9,436,216 | B2* | 9/2016 | Yukawa | H01Q 1/2266 |
| 2007/0097608 | A1* | 5/2007 | Matsutani | F16M 11/10 361/679.22 |
| 2012/0155004 | A1* | 6/2012 | Yukawa | G06F 1/1601 361/679.21 |
| 2014/0146460 | A1* | 5/2014 | Liu | G06F 1/203 361/679.26 |
| 2014/0293528 | A1* | 10/2014 | Ohishi | G06F 1/1637 361/679.26 |

* cited by examiner

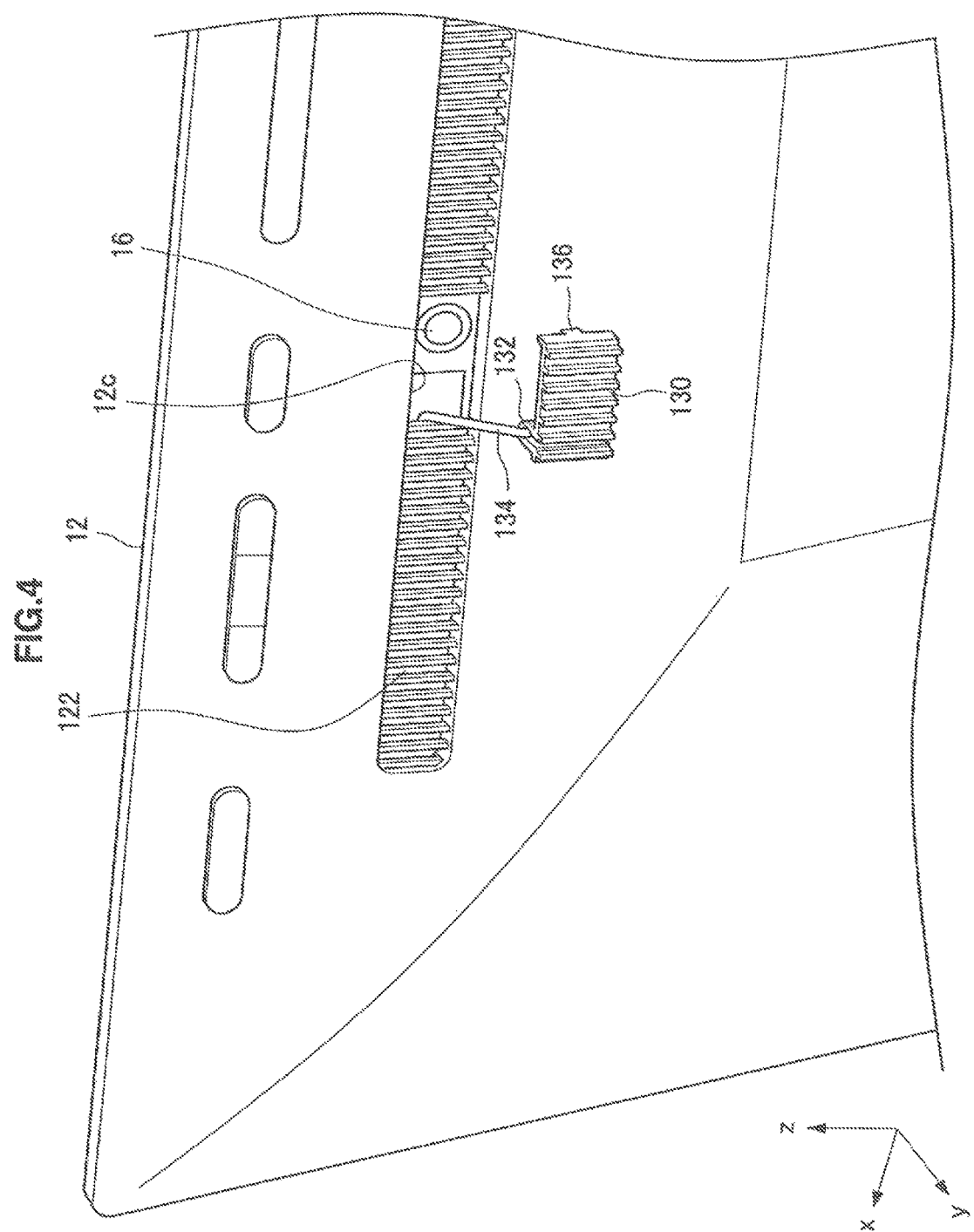

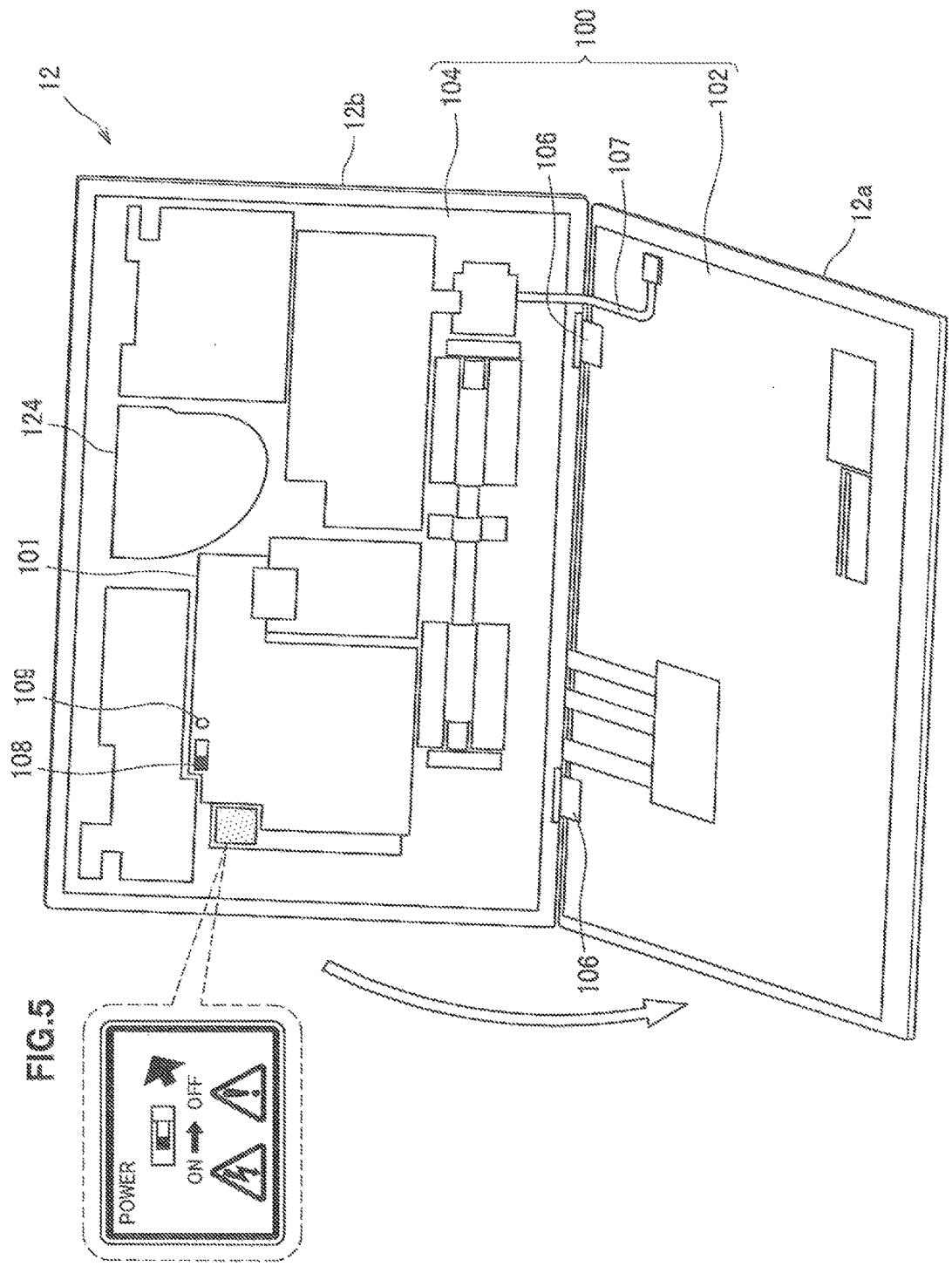

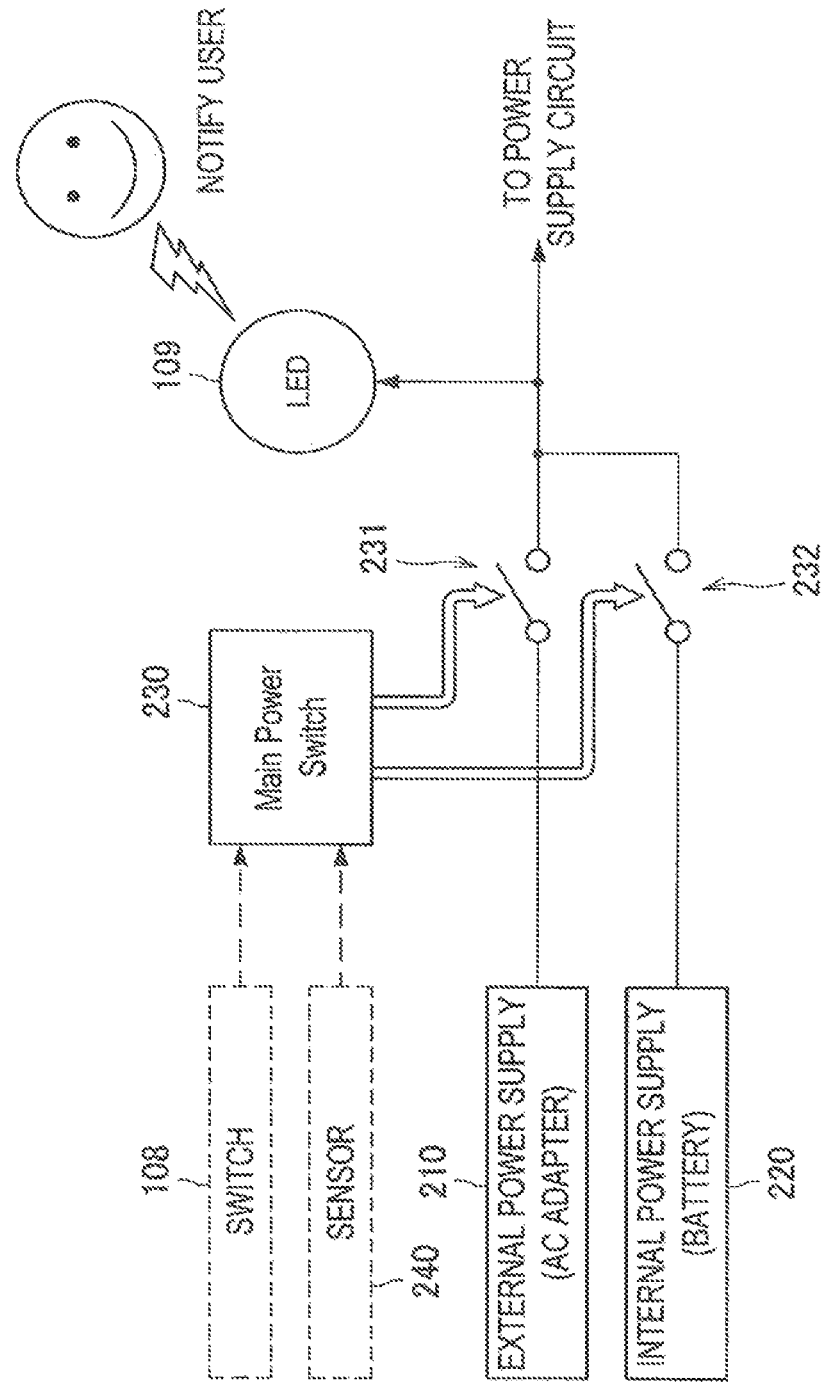

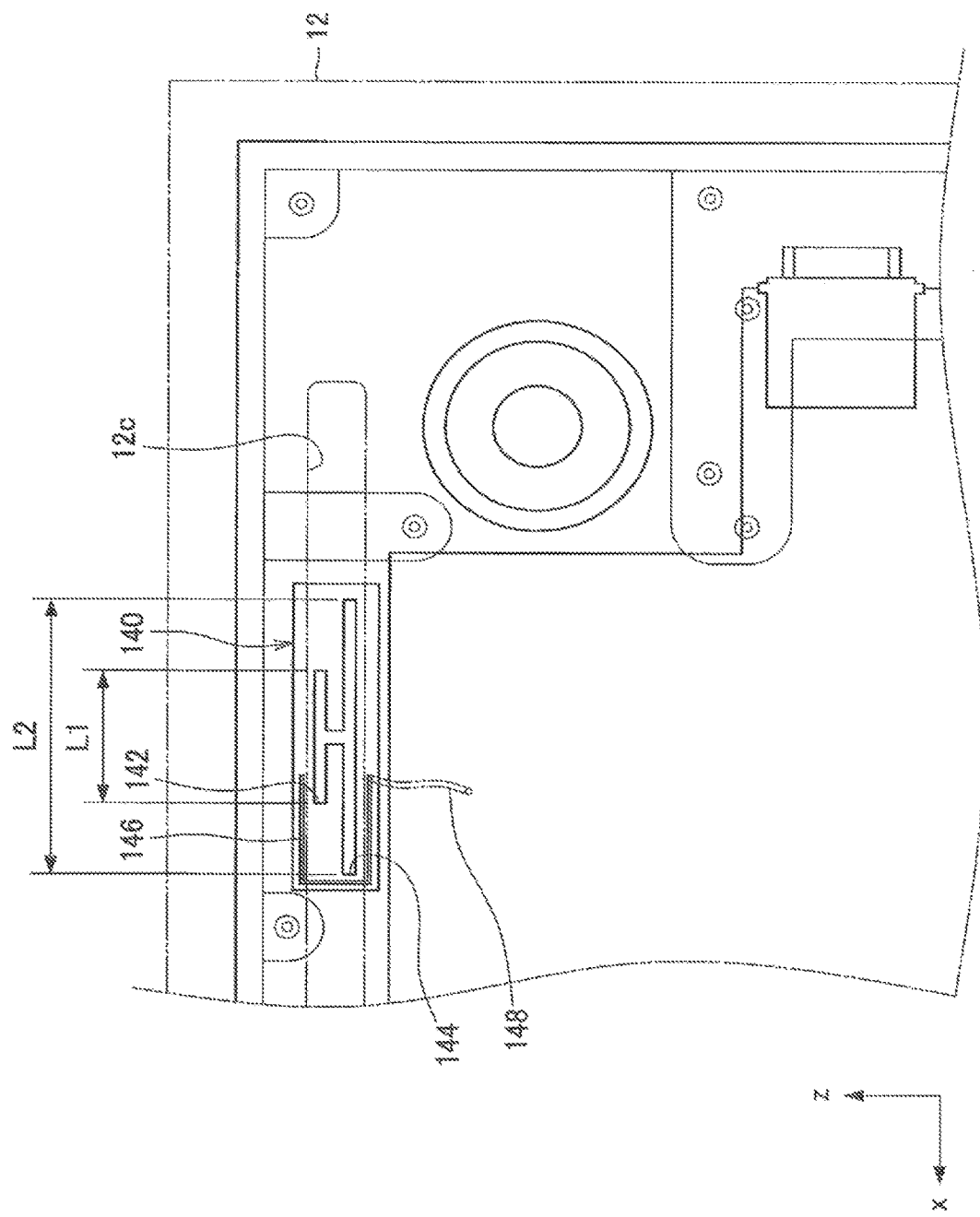

INFORMATION PROCESSING APPARATUS

CROSS REFERENCE TO RELATED APPLICATIONS

The present disclosure is a continuation of U.S. patent application Ser. No. 14/338,126 filed in USPTO on Jul. 22, 2014, which claims the priority benefit of Japanese Priority Patent Application JP 2013-159960 filed in the Japan Patent Office on Jul. 31, 2013, the entire contents of which are incorporated herein by reference.

BACKGROUND

The present disclosure relates to an information processing apparatus having a plurality of functions in a case.

In recent years, information processing apparatus having many integrated functional units in a single case, such as a display integrated desktop PC or a tablet terminal has been used in many situations. Such an information processing apparatus includes, for example, a control unit such as a CPU, a storage device such as a hard disk drive, a flash memory, a communication module, an input device, a display device, a sound output device.

In an information processing apparatus equipped with a plurality of functional units like this, the installation position and the installation manner for each functional unit are restricted in order to cause each functional unit to function properly. For example, in the information processing apparatus disclosed in JP 2012-128783A, a slit for heat radiation is formed in the upper surface and the bottom surface of the case, and a wireless communication unit is disposed near the center of the case so as not to be covered by a metal member.

SUMMARY

However, when the functional units of an information processing apparatus are independently arranged in order to ensure the functionality of each functional unit as in JP 2012-128783A, the maintainability of the apparatus reduces. Also, some functional units have to have an opening through the case like a heat radiation port, or other functional units have a limited range of material for the installation area like a wireless communication unit in order to cause the functional unit to function. Due to such limitations, when a plurality of openings is formed in the case or a member having different quality of material is used for a specific area of the case, the rigidity of the case reduces and the designability also reduces.

In view of such a situation, it is desirable that a plurality of functions of an information processing apparatus be arranged in a concentrated manner.

The present disclosure provides an information processing apparatus having a case provided with an opening to which two or more functional units are allocated.

According to the present disclosure, a plurality of functional units of an information processing apparatus may be arranged in a concentrated manner by allocating the functional units to an opening provided in a case and causing the functional units to function. The concentrated arrangement of the functional units enables characteristics such as maintainability and designability of the information processing apparatus to be improved.

As described above, according to the present disclosure, a plurality of functions of an information processing apparatus may be arranged in a concentrated manner.

BRIEF DESCRIPTION OF THE DRAWINGS

FIG. 4 is a partially enlarged view of the rear surface of a main body, illustrating a mounting area for a fixing member according to the embodiment.

FIG. 5 is an explanatory illustration of the information processing apparatus with the main body divided according to the embodiment.

FIG. 6 is an explanatory illustration of a state display function of the main power switch using an LED according to the embodiment.

FIG. 7 is a partially enlarged view illustrating the configuration of a slot antenna according to the embodiment.

DETAILED DESCRIPTION OF THE EMBODIMENT

A preferred embodiment of the present disclosure will be described in detail below with reference to the accompanying drawings. In the present description and the drawings, the components having substantially the same functional configuration are denoted by the same symbols and thus a redundant description is omitted.

Description will be given in the following order.
1. Schematic Configuration of Information Processing Apparatus
   1.1 Appearance
   1.2 Disposition Configuration of Functional Units
2. Configuration of Concentrated Functional Units
   2.1 Speaker
   2.2 Heat Radiation Fan
   2.3 Release Structure of Main Body
   2.4 Communication Antenna
3. Summary <1. Schematic Configuration of Information Processing Apparatus>

[1.1. Appearance]

Figure 1:
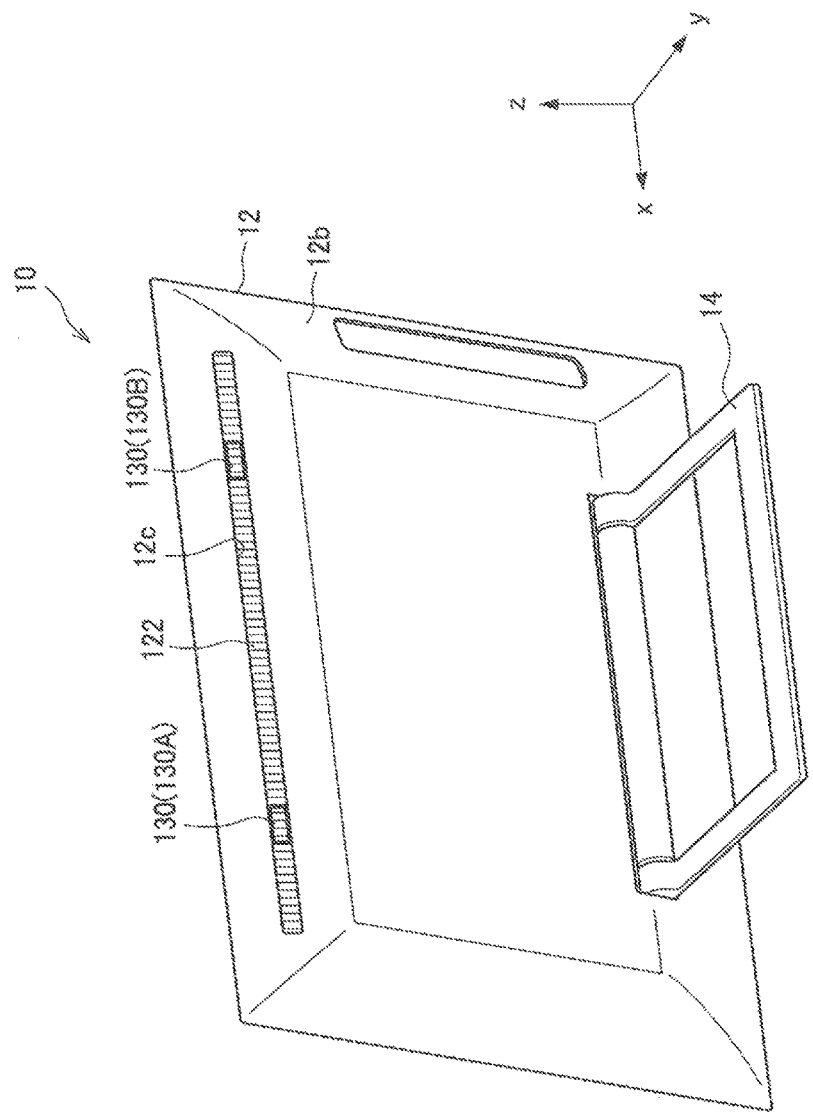
FIG. 1 is a schematic perspective rear view of an information processing apparatus according to an embodiment in the present disclosure.

First, the schematic configuration of an information processing apparatus 10 according to the embodiment of the present disclosure will be described with reference to FIG. 1. FIG. 1 is a schematic perspective view from the side of a rear surface 12b of the information processing apparatus 10 according to the embodiment. In the following, the height direction (z direction) is defined as the vertical direction when the information processing apparatus 10 is placed on an installation surface. Also, the width direction (x direction) is defined as the direction that is parallel to the installation surface and perpendicular to the depth direction (y direction) of a main body 12.

The information processing apparatus 10 according to the present embodiment is a display integrated desktop PC. As illustrated in FIG. 1, the information processing apparatus 10 includes the main body 12, and a stand 14 which is provided on the rear surface 12b included in a case of the main body 12. The main body 12 includes a display unit (symbol 150 of FIG. 3) that displays information on a front surface 12a, and a system mechanism such as a substrate and a device within the case of the main body 12. The stand 14 is a member that supports the main body 12 so that the front surface 12a maintains a position having a predetermined angle of inclination with respect to the vertical direction when the main body 12 is placed on an installation surface. Two members, the main body 12 and the stand 14 are connected to each other by two rotating mechanisms (symbols 15A, 15B of FIG. 2).

The information processing apparatus 10 includes an opening 12c, which extends in the width direction, in an upper portion of the rear surface 12b of the main body 12. The opening 12c is provided with heat radiation ribs 122 and rib members 130A, 1306 which are removable from the opening 12c. The heat within the case is efficiently dissipated by the heat radiation ribs 122 and the rib members 130A, 130B.

In the inner space of the case with respect to the heat radiation ribs and the rib members 130A, 130B, multiple functional units out of the functional units included in the information processing apparatus 10 are disposed so as to face the formation position of the opening 12c. The multiple functional units of the information processing apparatus 10 are disposed so as to face the single opening 12c in a concentrated manner, and many openings may not be formed in the rear surface 12b, and so the rear surface 12b looks neat.

[1.2. Disposition Configuration of Functional Units]

Figure 2:
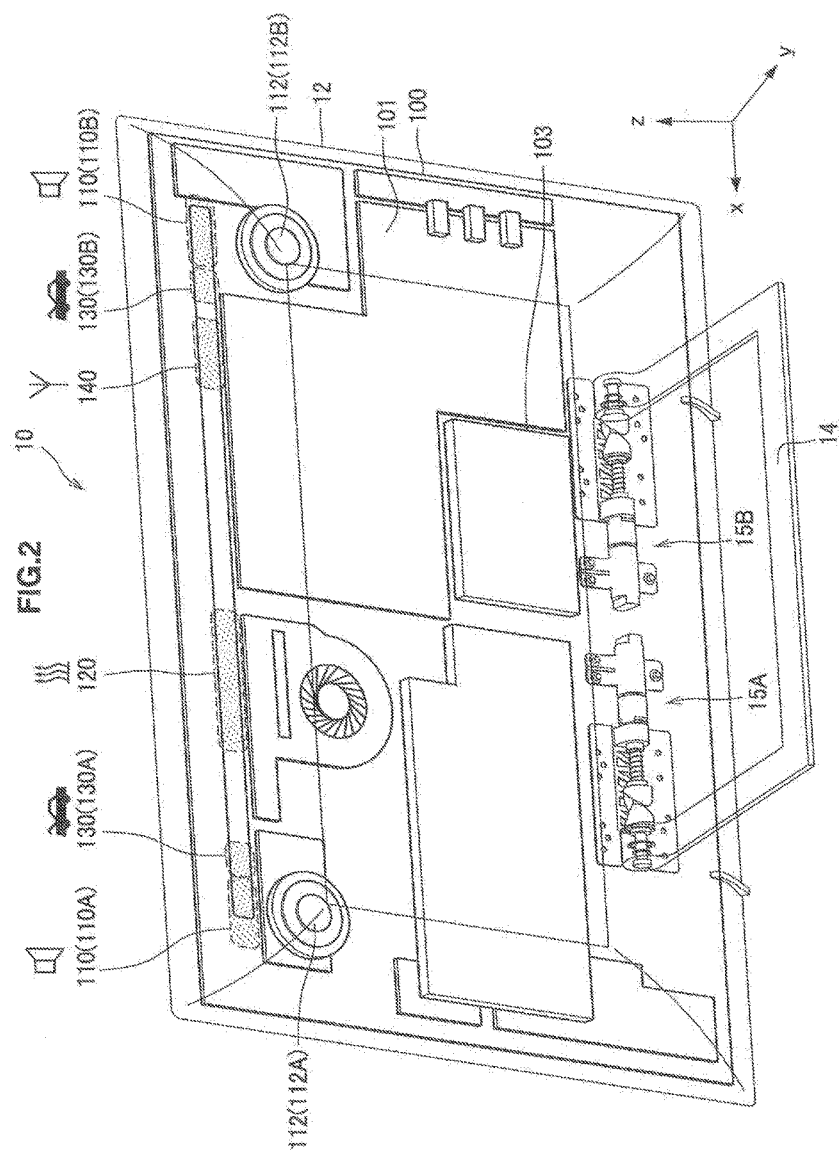
FIG. 2 is an explanatory rear view of an internal state of the information processing apparatus according to the embodiment, and illustrates the disposition of functional units.

As illustrated in FIG. 2, multiple functional units are provided within the main body 12 of the information processing apparatus 10. FIG. 2 is an explanatory rear view of an internal state of the information processing apparatus 10 according to the embodiment, and illustrates the disposition of the functional units.

As illustrated in FIG. 2, within the case of the main body 12 of the information processing apparatus 10, a system mechanism 100 is provided that includes functional units such as a substrate 101 on which a CPU and a memory are mounted, a hard disk drive 103, and a battery. In the information processing apparatus 10, speakers 112, a heat radiation fan 124, a communication antenna, and a fixing mechanism are provided in a concentrated manner, the fixing mechanism being configured to fix the front surface 12a and the rear surface 12b with the system mechanism 100 being housed within the case.

The opening 12c formed in an upper portion of the rear surface 12b of the main body 12 has multiple functions corresponding to the concentrated functional units. The opening 12c according to the present embodiment functions as sound output ports 110A, 1106 for speakers 112A, 112B correspondingly to the speakers 112A, 112B provided on both ends of the main body 12 in the width direction. In addition, the opening 12c functions as a heat radiation port 120 correspondingly to the heat radiation fan 124 provided in the central portion of the main body 12 in the width direction. Furthermore, in the opening 12c, a mounting area (symbol 16 of FIG. 4) for a fixing member is disposed according to the installation positions of the rib members 130A, 130B which are removable from the opening 12c. Also, the opening 12c is provided with a communication antenna 140.

In this manner, the opening 12c, which is formed in an upper portion of the rear surface 12b of the main body 12, has multiple functions. Here, some functional units have constraints on installation, and so in order to cause multiple different functional units to function properly in a concentrated manner, the disposition and the installation manner for each functional unit are adjusted. Hereinafter, the configuration of each of the functional units concentrated in the information processing apparatus 10 of the present embodiment will be described in detail.

<2. Configuration of Concentrated Functional Units>

[2.1. Speaker]

The information processing apparatus 10 according to the present embodiment includes the two speakers 112A, 112B on both ends in an upper portion of the main body 12 in the width direction. Provision of the speakers 112A, 112B on the right and left with respect to the front surface 12a enables stereophonic reproduction of sound, and realistic feeling of reproduced sound may be enhanced.

Figure 3:
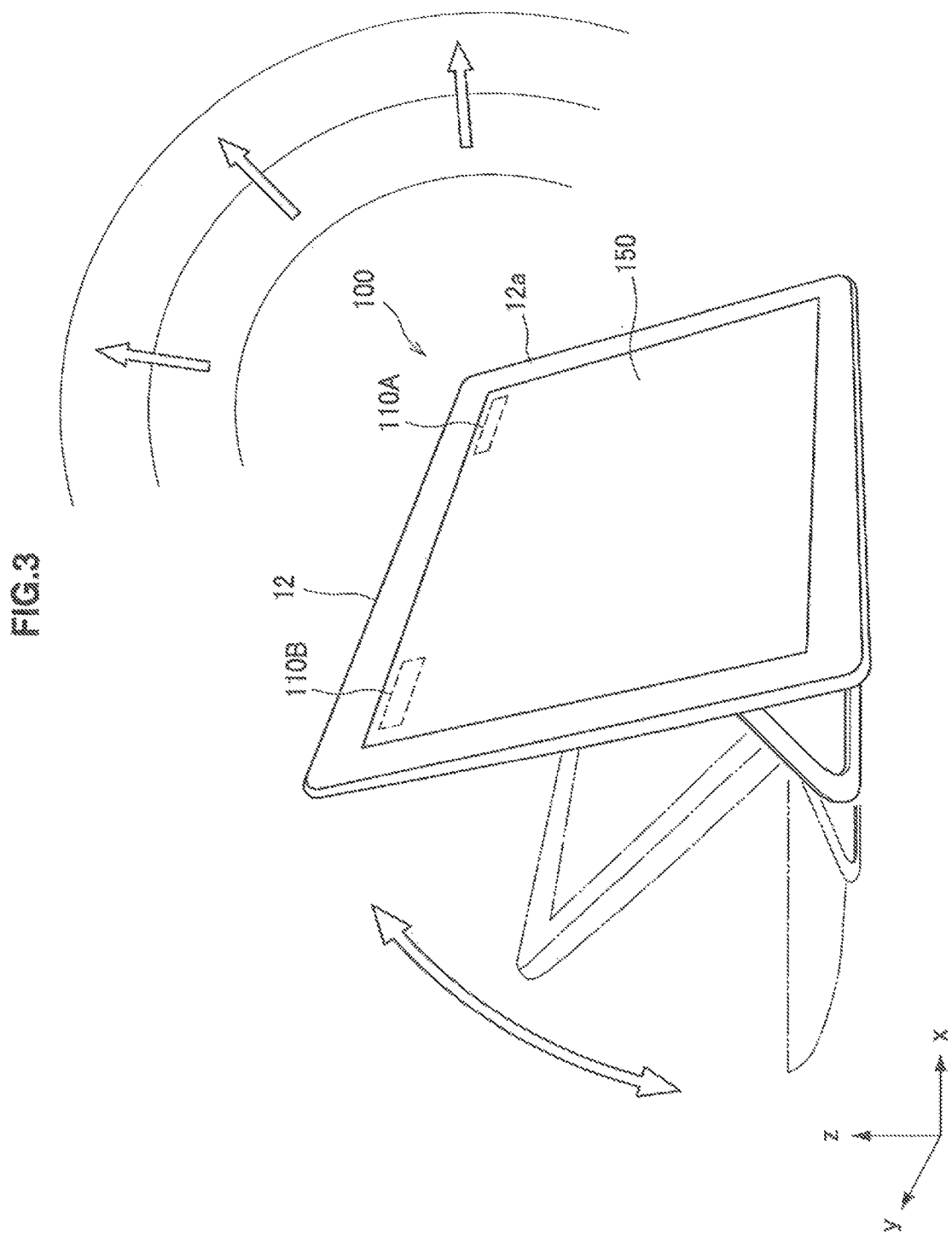
FIG. 3 is an explanatory illustration for the disposition and the effect of a sound output port according to the embodiment.

Sound from the speakers 112A, 112B is outputted through the sound output ports 110A, 110B at both end portions of the opening 12c which is provided in an upper portion of the main body 12. Therefore, the sound transmits upward through the sound output ports 110A, 110B. Outputting the sound upward allows an equalizer to achieve both sound field adjustment and sound volume adjustment easily. Consequently, as illustrated in FIG. 3, a constant sound field may be maintained regardless of the angle of inclination of the main body 12 even when the information processing apparatus 10 is used with the main body 12 substantially horizontal or used with the main body 12 upright in desktop style.

[2.2. Heat Radiation Fan]

The heat radiation fan 124 is a functional unit that actively releases heat to the outside, the heat being emitted from the system mechanism 100 provided within the case of the main body 12. Rotation of the fan allows high temperature air to be released from the inside of the case through the heat radiation port 120. The heat radiation port 120 is heated to a high temperature. For this reason, the heat radiation port 120 may be provided in the central portion of the opening 12c in order to avoid contact between a user and a highly heated area. Because the opening 12c, which functions as the heat radiation port 120, is provided in an upper portion of the main body 12, the heat radiation port 120 is not blocked even when the angle of inclination of the main body 12 is changed, and thus the heat within the case is allowed to be released to the outside constantly.

In addition, the opening 12c is provided with the heat radiation rib 122 and the rib members 130A, 130B that cover the opening. Thus, the heat from the heat radiation port 120 may be released more effectively. With the opening 12c being covered, the functional units concentrated in the opening 12c are not exposed. Consequently, it is possible to prevent a user from touching the functional units. Also, as illustrated in FIG. 1, when the opening 12c is viewed from the outside, only the heat radiation rib 122 and the rib members 130A, 130B are seen by a user, and thus the rear surface 12b presents neat appearance with uniformity.

[2.3. Release Structure of Main Body]

The information processing apparatus 10 according to the present embodiment includes the system mechanism 100 between the front surface 12a and the rear surface 12b of the main body 12. When maintenance is performed on the system mechanism 100, fixation between the front surface 12a and the rear surface 12b is released so as to expose the system mechanism 100. In order to allow the front surface 12a and the rear surface 12b to be released from each other easily in the above step, the front surface 12a and the rear surface 12b according to the present embodiment are fixed by only two fixing members (not illustrated). As a fixing member, a fastening member such as a screw may be used.

A mounting area 16, to which a fixing member is fixed, is disposed correspondingly to the opening 12c as illustrated in FIG. 4.

FIG. 4 is a partially enlarged view of the rear surface 12b of the main body 12, illustrating the mounting area 16 for a fixing member. As illustrated in FIG. 4, the mounting area 16 disposed correspondingly to the opening 12c is normally covered by the rib members 130 provided between some heat radiation ribs 122, and the mounting area 16 is exposed by removing the rib member 130 from the opening 12c.

As illustrated in FIG. 4, the rib member 130 is a member in which a plurality of ribs is formed similarly to the heat radiation ribs 122, and may be removed by bending the heat radiation ribs 122 composed of a flexible member in the width direction. One end 132 of the rib member 130 is connected to the main body 12 via a connecting member 134. Even when the rib member 130 is removed from the opening 12c, the rib member 130 is still connected to the main body 12 via the connecting member 134, and thus the rib member 130 is not lost when removed. Also, the other end of the rib member 130 is provided with a hook 136 that is engaged with a heat radiation rib 122 when the rib member 130 is mounted on the opening 12c. The hook 136 is hooked on the heat radiation rib 122, and thereby the rib member 130 is reliably fitted into the opening 12c.

When the rib member 130 is removed and the fixing member is removed from the mounting area 16, fixation between the front surface 12a and the rear surface 12b is released, and the system mechanism 100 is exposed. The system mechanism 100 includes a front part 102 and a rear part 104 as illustrated in FIG. 5. The front part 102 and the rear part 104 each provide an integrated panel on which the functional units of the information processing apparatus 10 are mounted.

In the front part 102, there are disposed functional units, for example, the display unit 150 and near field communication (NFC) that are provided on the side of the front surface 12a of the main body 12. In the rear part 104, there are disposed functional units, for example, the substrate 101 and the heat radiation fan 124 that are provided on the side of the rear surface 12b of the main body 12. When fixation between the front surface 12a and the rear surface 12b is released, the front surface 12a is moved along with the front part 102 and the rear surface 12b is moved along with the rear part 104.

The front part 102 and the rear part 104 are disposed so as to be overlapped in the depth direction within the case. In the state of being overlapped, the system mechanism 100 and the case may be stably fixed to each other by keeping the front part 102 and the rear part 104 combined. The front part 102 and the rear part 104 are connected via one end, for example, the end on the bottom side, and the front part 102 and the rear part 104 may be separated around the connecting end as a rotation center. To combine the front part 102 and rear part 104, a magnet may be used, for example. When a magnet is used for combining the front part 102 and the rear part 104, for example pushing the front part 102 from the rear part 104 allows the two parts to be separated, and pushing the front part 102 with a short stroke is sufficient for the separation.

FIG. 5 illustrates the information processing apparatus 10 with the main body 12 removed. The system mechanism 100 is provided with signal cables and/or wires that connect between the functional units, and some of the signal cables and/or wires connect between the functional units in the front part 102 and the functional units in the rear part 104. When the fixing member provided in an upper portion of the main body 12 is removed, the main body 12 according to the present embodiment allows the front surface 12a side and the rear surface 12b side to be separated around the connecting end on the bottom side as a rotation center. In order to separate the main body 12 safely without any cut of a signal cable and a wire in this separation mechanism, the signal cables and/or wires that connect the functional units in the front part 102 and the functional units in the rear part 104 are disposed near the rotation center.

When the main body 12 is separated by holding either one of the front surface 12a side and the rear surface 12b side, a load may be applied to the signal cables and/or wires that connect the functional units in the front part 102 and the functional units in the rear part 104. For this reason, the front part 102 and the rear part 104 are connected by belts 106 on the bottom side as the rotation center.

The belts 106 are composed of an insulating material and provided at respective both ends in the width direction. The length of each of the belts 106 is set to be shorter than the minimum length of the signal cables and/or wires that connect the functional units in the front part 102 and the functional units in the rear part 104. Therefore, even when the front part 102 and the rear part 104 are separated and tension is applied to the belts 106, no tension is applied to the signal cables and/or wires.

Because the information processing apparatus 10 according to the present embodiment allows the system mechanism 100 within the main body 12 to be easily exposed, reliable safety is demanded. For example, the main body may be activated by wireless communication or a built-in battery while the system mechanism 10 is exposed, and thus it is desirable that a function of reliably turning off the power supply within the system be provided.

By providing a switch 108 capable of turning off AC adapter as an external power supply 210 and a battery as an internal power supply 220 simultaneously when the system mechanism 100 is exposed, the information processing apparatus 10 according to the present embodiment enables the two power supplies to be shut down reliably. For example, a slide switch, by which a slide is moved to turn on/off the power supply, may be used as the switch 108 and may be provided on the substrate 101 as illustrated in FIG. 5. An operation of the switch 108 causes the main power switch to be activated which is capable of turning off the external power supply 210 and the internal power supply 220 simultaneously, and thus the external power supply 210 and the internal power supply 220 are turned off simultaneously.

As illustrated in FIG. 5, a display for guiding a user to turn off the power supply reliably may be provided near the switch 108.

In order to guide a user to turn off the power supply reliably, LED 109 may be provided near the switch 108 as a state display that indicates a state of the main power switch. The LED 109 lights on in the case where at least the system mechanism 100 is exposed, and both the external power supply 210 and the internal power supply 220 are not turned off. With the LED 109 lit, a user easily notices the presence of the switch 108 provided near the LED 109, thereby making it possible to guide a user to turn off the power supplies 210, 220.

FIG. 6 illustrates a state display function of a main power switch 230 using the LED 109. As illustrated in FIG. 6, the main power switch 230 includes a first switch 231 that turns on/off the external power supply 210, and a second switch 232 that turns on/off the internal power supply 220. The main power switch 230 operates the first switch 231 and the second switch 232 according to an operational input to the switch 108.

When an operational input is made by the switch 108 to turn off the external power supply 210 and the internal power supply 220 simultaneously, the main power switch 230 turns off the first switch 231 and the second switch 232. In this manner, the external power supply 210, the internal power supply 220, and a power supply circuit are shut down. The turning off of the first switch 231 and the second switch 232 causes current supply to the LED 109 to be shut down, and the LED 109 lights off. Consequently, a user is able to recognize that the external power supply 210 and the internal power supply 220 have been turned off.

The main power switch 230 may be operable by a user operating the switch 108 or may be operable automatically. For example, a sensor 240 is provided which detects that the system mechanism 100 is exposed. After the sensor 240 detects that the system mechanism 100 is exposed, upon receiving a result of the detection, the main power switch 230 turns off the first switch 231 and the second switch 232. In this manner, all the power supplies are automatically turned off when the system mechanism 100 is exposed, and the safety is thereby further improved.

[2.4. Communication Antenna]

Disposition of the communication antenna is restricted according to the quality of material of the case of the information processing apparatus 10. For example, from the viewpoint of demanded rigidity and designability, it may be demanded that the rear surface 12b of the information processing apparatus 10 be formed of metal. In the case where metal is used for the rear surface 12b, when a typical communication antenna is used, radio waves are blocked and normal function is not achieved.

Thus, the following approach is typically made: a metal component is provided with a notch, a resin component having the same color as the metal component is inserted into the notch, and a wireless communication antenna is disposed on the rear surface of the resin component. However, this approach significantly reduces the designability of the apparatus. Alternatively, the designability of the apparatus may be maintained by using a component which is formed by insert-molding a metal component into a resin mold. However, this approach is normally accompanied by significant increase in costs.

Thus, in the information processing apparatus 10 according to the present embodiment, a communication antenna for wireless LAN or Bluetooth (registered trademark) is formed by a slot antenna which is provided in the opening 12c of the rear surface 12b of the main body 12 to be resonated with the opening 12c. The rear surface 12b of the main body 12 is formed of, for example, a metal material such as aluminum.

FIG. 7 illustrates a configuration example of the slot antenna 140 according to the present embodiment. The slot antenna 140 according to the present embodiment is configured by forming a first slot 142 and a second slot 144 in a metal plate corresponding to two different frequencies. For example, the frequency corresponding to the first slot 142 is 5.0 GHz, and the frequency corresponding to the second slot 144 is 2.4 GHz. The shape of each of the slots 142, 144 is defined based on at least one of a frequency to be transmitted or received and an impedance according to the size of the opening 12c.

For example, the lengths (also referred to as "slot lengths") L1, L2 of the slots 142, 144 in the width direction may be defined as approximately ½ wavelength of the frequency to be transmitted or received. Because the slot antenna 140 according to the present embodiment is provided in the opening 12c, it is desirable that the slots 142, 144 corresponding to the size of the opening 12c be formed. Thus, the widths (also referred to as "slot widths") of the slots 142, 144 in the height direction (z direction) may be defined with impedance adjustment so as to correspond to the size of the opening 12c.

The slot antenna 140 according to the present embodiment is configured so as to be adjustable to both of two different frequency bands according to the lengths and shapes of the slots 142, 144.

As illustrated in FIG. 7, such a slot antenna 140 is attached to the inner side of the case with respect to the rear surface 12b so that the first slot 142 and second slot 144 are located in the opening 12c. Consequently, the rear surface 12b composed of a metal material also functions as an antenna and resonates with the slot antenna 140, thereby being able to effectively receive and transmit radio waves. In this manner, with the use of the slot antenna 140, the communication antenna may be configured by utilizing a small aperture of the opening 12c.

In order to fix the slot antenna 140 to the rear surface 12b more reliably, the slot antenna 140 once being attached to the rear surface 12b, for example, a supporting part 146 may be provided at part of the peripheral edge of the metal plate of the slot antenna 140, and the supporting part 146 and the rear surface 12b may be connected by a harness 148. Also, a fixing member for fixing the metal plate of the slot antenna 140 and the rear surface 12b in the height direction may be provided on both ends of the slot antenna 140 in the width direction.

<3. Summary>

So far, the information processing apparatus 10 according to the present embodiment has been described. The information processing apparatus 10 allocates multiple functional units to the opening 12c and causes the functional units to function, the opening 12c being provided in an upper portion of the rear surface 12b of the main body 12. In the information processing apparatus 10 according to the present embodiment, the sound output ports 110, the heat radiation port 120, the mounting area 16 for the fixing member that fixes the main body 12, and the slot antenna 140 are concentrated in the opening 12c. By providing the functional units as described above, it is possible to use a metal material for the rear surface 12b, and the rigidity of the case may be sufficiently ensured. The concentrated arrangement of the functional units enables the maintainability and designability to be improved.

So far, the preferred embodiment of the present disclosure has been described in detail with reference to the accompanying drawings. However, the technical scope of the present disclosure is not limited to the above example. It is apparent that in the scope of technical idea described in the appended claims, various alterations and modifications may occur to persons of ordinary skill in the technical field of the present disclosure, and it should be understood that they will naturally come under the technical scope of the present disclosure.

In the above-described embodiments, as one example, the sound output ports 110, the heat radiation port 120, the mounting area 16 for the fixing member that fixes the main body 12, and the slot antenna 140 are concentrated in the opening 12c. However, the present technology is not limited to this example. For example, an intake port, and an operational function such as a reset button provided in the system mechanism may be further concentrated and disposed in the opening 12c.

Although the opening 12c is formed in an upper portion of the rear surface 12b of the main body 12 in the above-described embodiments, the present technology is not limited to this example. For example, an opening may be provided in the side of the rear surface 12b of the main body 12. The position at which an opening is formed may be determined as appropriately according to the functional units to be concentrated.

Although the information processing apparatus 10 is a display integrated PC in which the main body 12 is supported by the stand 14 in the above-described embodiments, the present technology is not limited to this example. For example, the information processing apparatus is applicable to a notebook personal computer.

Additionally, the present technology may also be configured as below.

(1) An information processing apparatus including
a case which is provided with an opening,
wherein two or more functional units are allocated to the opening.

(2) The information processing apparatus according to (1),
wherein the opening is provided in an upper portion of the case.

(3) The information processing apparatus according to (1) or (2),
wherein the opening is formed to be long in a width direction of the case.

(4) The information processing apparatus according to any one of (1) to (3),
wherein the opening is provided in a rear surface of the case, and the rear surface of the case is composed of a metal material.

(5) The information processing apparatus according to any one of (1) to (4),
wherein the functional units are allocated to the opening, the functional units including at least two of a heat radiation port, a sound output port, a communication antenna, and a mounting area for a fixing member that fixes a front surface and a rear surface of the case.

(6) The information processing apparatus according to (5),
wherein the communication antenna is a slot antenna which is formed by disposing a metal plate, in which a slot is formed, in the opening, and
wherein a shape of the slot is defined based on at least one of a frequency to be transmitted or received and an impedance according to a size of the opening.

(7) The information processing apparatus according to (5) or (6),
wherein the sound output port is provided at both ends of the opening.

(8) The information processing apparatus according to any one of (5) to (7),
wherein the heat radiation port is provided at a central portion of the opening.

(9) The information processing apparatus according to any one of (5) to (8),
wherein the opening is provided with heat radiation ribs that cover the opening, the heat radiation ribs being partially removable from the opening, and
wherein a removable portion of the heat radiation ribs is provided with the mounting area for the fixing member.

(10) The information processing apparatus according to any one of (5) to (9), further including:

a detection unit configured to detect that a system mechanism provided within the case is exposed when the fixing member is removed; and
a main power switch configured to turn on or off each of one or more power supplies in the system mechanism based on a result of the detection by the detection unit.

(11) The information processing apparatus according to any one of (5) to (10), further including:
a main power switch configured to turn on or off each of one or more power supplies in the system mechanism provided within the case; and
a state display unit configured to indicate a state of the main power switch,
wherein the main power switch and the state display unit are within the case.

What is claimed is:

1. An information processing apparatus, comprising
a case that comprises an opening,
wherein at least two functional units are in the opening,
wherein the at least two functional units are configured to execute different functions, and
wherein at least one functional unit of the at least two functional units is in the opening, based on a function executed by the at least one functional unit.

2. The information processing apparatus according to claim 1,
wherein the opening is in one of an upper portion or a side portion of the case.

3. The information processing apparatus according to claim 1,
wherein the opening extends in a width direction of the case.

4. The information processing apparatus according to claim 1,
wherein the opening is in a rear surface of the case, and
wherein the rear surface of the case is composed of a metal material.

5. The information processing apparatus according to claim 1,
wherein the at least two functional units in the opening comprise at least one of a heat radiation port, a sound output port, a communication antenna, or a mounting area for a fixing member that fixes a front surface and a rear surface of the case.

6. The information processing apparatus according to claim 1,
wherein one of the at least two functional units in the opening comprises a communication antenna,
wherein the communication antenna is a slot antenna,
wherein the slot antenna comprises a metal plate that have a slot, wherein the metal plate is in the opening, and
wherein a shape of the slot is defined based on at least one of a frequency to be transmitted or received and an impedance based on a size of the opening.

7. The information processing apparatus according to claim 1,
wherein one of the at least two functional units in the opening comprises a sound output port, and
wherein the sound output port is at both ends of the opening.

8. The information processing apparatus according to claim 1,
wherein one of the at least two functional units in the opening comprises an operational function.

9. The information processing apparatus according to claim 1, wherein one of the at least two functional units in the opening comprises a heat radiation port, and wherein the heat radiation port is at a central portion of the opening.

10. The information processing apparatus according to claim 1, wherein the opening comprises heat radiation ribs that cover the opening, wherein the heat radiation ribs are partially removable from the opening, and wherein a removable portion of the heat radiation ribs comprises a mounting area for a fixing member that fixes a front surface and a rear surface of the case.

11. The information processing apparatus according to claim 1, wherein the at least two functional units are concentrated in the opening.

* * * * *